United States Patent [19]

Matsuda et al.

[11] Patent Number: 4,634,645

[45] Date of Patent: Jan. 6, 1987

[54] METHOD OF FORMING RESIST MICROPATTERN

[75] Inventors: Tadahito Matsuda; Katsuhiro Harada; Shigeru Moriya, all of Isehara; Tetsuyoshi Ishii, Zama, all of Japan

[73] Assignee: Nippon Telegraph and Telephone Corporation, Tokyo, Japan

[21] Appl. No.: 721,306

[22] Filed: Apr. 9, 1985

[30] Foreign Application Priority Data

Apr. 13, 1984 [JP] Japan .................... 59-74690
Feb. 25, 1985 [JP] Japan .................... 60-35692

[51] Int. Cl.⁴ .............................. G03C 5/00
[52] U.S. Cl. ..................... 430/30; 430/296; 430/312; 430/314; 430/317; 430/942; 430/967
[58] Field of Search .............. 430/30, 296, 312, 314, 430/317, 942, 967

[56] References Cited

U.S. PATENT DOCUMENTS

| | | | |
|---|---|---|---|
| 4,215,935 | 8/1980 | Loebach | 355/67 |
| 4,457,820 | 7/1984 | Bergeron et al. | 204/192 E |
| 4,474,642 | 10/1984 | Nakane et al. | 156/643 |
| 4,479,848 | 10/1984 | Otsubo et al. | 156/626 |
| 4,528,438 | 7/1985 | Poulsen et al. | 219/121 PE |
| 4,546,066 | 10/1985 | Field et al. | 430/314 |

FOREIGN PATENT DOCUMENTS

0049072 4/1979 Japan .................... 430/317

Primary Examiner—John E. Kittle
Assistant Examiner—Patrick J. Ryan
Attorney, Agent, or Firm—Frishauf, Holtz, Goodman & Woodward

[57] ABSTRACT

A resist pattern is formed on a substrate by forming a resist on a substrate and radiating an energy beam carrying predetermined pattern information onto the resist, thereby forming a recessed pattern in a surface portion of the resist so as not to extend through the resist. A flat mask layer is formed on the resist including the recessed pattern. The mask layer is uniformly etched along a direction of thickness thereof until at least a surface of the resist is exposed to allow the mask layer to remain on at least a bottom of the recessed pattern, thereby forming a mask pattern comprising the remaining residual mask layer. Finally, the resist is etched by using the mask pattern as an etching mask.

23 Claims, 16 Drawing Figures

METHOD OF FORMING RESIST MICROPATTERN

BACKGROUND OF THE INVENTION

1. Field of the Invention

The present invention relates to a method of forming a resist pattern and, more particularly, to a method of forming a resist micropattern on a substrate with high precision in a relatively short period of time.

2. Description of the Prior Art

A conventional simultaneous pattern transfer technique has been used as a means for forming a pattern of semiconductor ICs or the like on a substrate by using a mask. With this technique, a film of a resin material, i.e., a resist, sensitive (crosslinked or decomposed) to an energy beam is formed, and an energy beam carrying pattern information, such as light, irradiates (i.e., exposes) the resist film which is then developed to obtain a resist pattern. The semiconductor substrate is processed using the resultant resist pattern.

When the resist pattern is miniaturized, the resolution of the pattern to be formed is degraded due to the diffraction phenomenon. For this reason, high energy beams such as electron beams or X-rays are effectively used for fine lithography. However, even if such a high energy beam is used, the resolution of the resultant pattern is still low.

An example of a conventional method will be described wherein an electron beam is used as an energy beam and a positive electron beam resist material is used as a resist material to form a resist pattern. According to this method, the electron beam irradiates a positive electron beam resist film on a semiconductor substrate in an amount such that the resist film can respond to the beam, i.e., decomposed, along the direction of the entire thickness thereof. The electrons which enter into the resist film and the substrate collide with molecules and atoms thereof and are scattered back out of the substrate.

A scattering distance of these electrons generally falls within the range of several microns to several tens of microns although the distance varies depending on an energy level of the irradiated electron beam and a density of the substrate. During scattering of the electron beam, the positive resist material responds to the beam again. As a result, an area of the positive resist film decomposed by the beam is larger than an incident beam size (i.e., a beam profile) of the electron beam.

When the exposed resist film is developed under the above condition, a resist pattern has a size larger than that of the electron beam. In particular, when the pattern density is high, its resolution is greatly degraded by the back-scattered electrons generated when an adjacent pattern is irradiated with the electron beam.

The above situation also applies to the degradation of resolution due to the presence of the substrate such as the generation of secondary electrons in X-ray lithography leading to the degradation of resolution, or the generation of a standing wave in photolithography leading to pattern edge nonuniformity.

In addition, since an electron beam spot having a size smaller than the pattern size is used to scan within each pattern in the conventional method of forming a resist pattern with electron beams, a long scanning time is required.

SUMMARY OF THE INVENTION

It is, therefore, an object of the present invention to provide a method of forming a resist pattern on the basis of energy beam exposure, wherein a desired resist micropattern can be formed with high precision in a relatively short period of time.

In order to achieve the above object of the present invention, there is provided a method of forming a resist pattern on a substrate, comprising the steps of:
 (a) forming a resist on a substrate;
 (b) radiating an energy beam carrying predetermined pattern information onto the resist, thereby forming a recessed pattern in the surface portion of the resist so as not to extend through the resist;
 (c) forming a flat mask layer on the resist including the recessed pattern;
 (d) uniformly etching the mask layer along a direction of thickness thereof until at least a surface of the resist is exposed to allow the mask layer to remain on at least a bottom of the recessed pattern, thereby forming a mask pattern comprising the remaining mask layer; and
 (e) etching the resist by using the mask pattern as an etching mask.

According to a preferred embodiment of the present invention, when the mask layer is etched, the first appearing interface between the mask layer and the resist is detected by using a label material.

The energy beams include light, electron beams, X-rays and ion beams.

The present inventors have paid attention to the fact that the degradation of the pattern in energy beam exposure resulted from the following:

1. A stored energy level of an upper layer portion of the resist layer upon radiation of the energy beam is lower than that of a lower layer portion, i.e., a portion near the substrate, (which is caused by the back-scattered electrons, secondary electrons, a standing wave, and so on), and an upper layer portion represents the beam profile of the energy beam better than a lower layer portion.

2. When the resist layer is developed in the above-mentioned state, the upper layer portion, though having a low energy level, is dipped in a developing agent for a longer period of time. Thus the upper layer portion is dissolved along the lateral direction. The lower layer portion has a higher energy level, and is rapidly developed. Therefore, a wide region is developed in a short period of time.

3. As a result, the resultant resist pattern has a size larger than the energy beam profile. The present inventors have made extensive studies of the formation of a resist pattern by energy beam exposure, and found that the substrate influences could be eliminated by radiating an energy beam to form a pattern only in the upper layer portion (or a surface portion) of the resist. The resultant recessed pattern effectively reflected the beam profile of the incident energy beam. Based on these findings, the present inventors made the present invention. When the mask pattern is constituted by the mask layer remaining on at least the bottom of the recessed pattern and the resist layer is etched using the mask pattern, the finished resist pattern properly reflects the predetermined mask pattern. According to this technique of the present invention, the beam spot having a size smaller than the pattern width need not be used to scan within each pattern even if an electron beam is used as the energy beam. The pattern can be exposed by variable shaped electron beam having a size similar to the desired pattern width, and the exposure time can be shortened, thereby improving the throughput.

DETAILED DESCRIPTION OF THE PREFERRED EMBODIMENTS

The present invention will be described in detail with reference to the accompanying drawings. The same reference numerals denote the same parts throughout the drawings.

Figure 1A:
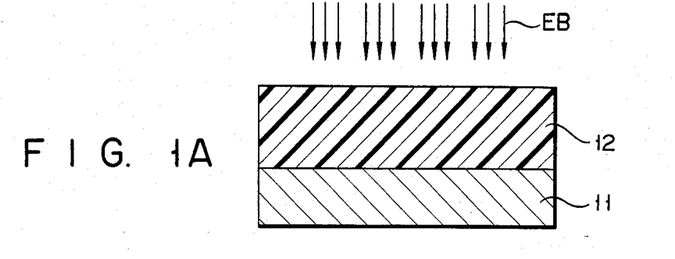
FIGS. 1A to 1E are sectional views for explaining the steps in forming a resist pattern according to a first embodiment of the present invention.

FIGS. 1A to 1E show a first embodiment of the present invention, wherein electron beams are used as energy beams and an electron beam resist material is used as a resist material. As shown in FIG. 1A, a layer 12 of an electron beam resist material is formed on a semiconductor wafer such as a silicon wafer 11 to a thickness of, for example, about 1 μm to 2 μm. A positive or negative electron beam resist material can be used. However, a positive resist material is preferable since it has higher resolution than a negative resist material.

The positive electron beam resist material includes those which are irradiated by the energy beam, and are then developed by developer, such as polymethylmethacrylate (PMMA), polyhexafluorobutylmethacrylate (FBM-G), and a phenylmethacrylatemethacrylic acid copolymer (φ-MAC) and those in which the electron beam serves as exposure and development, i.e., the resist material is completely decomposed and volatilizes by radiation of the electron beams alone, and the recessed pattern can be formed without using the developer. The examples of the resist material of the latter type are: a homopolymer of a monomer selected from the group consisting of arylmethacrylate (e.g., α,α-dimethylbenzyl methacrylate, α-methylbenzyl methacrylate, diphenyl methacrylate, triphenyl methacrylate, and phenyl methacrylate) and tert-butyl methacrylate; or a copolymer of at least one of the above-mentioned monomers and (halo)alkyl methacrylate represented by the general formula $CH_2=C(CH_3)COOR$ (wherein R is an alkyl or haloalkyl group having 1 to 5 carbon atoms).

Electron beams EB carrying predetermined pattern information irradiate the layer 12. As described above, according to the present invention, since a recessed pattern reflecting the beam profile of the electron beams is formed in only the upper layer portion of the layer 12 upon radiation of the beams EB, the dose is sufficiently smaller than that required for exposing the layer 12 throughout its entire thickness. More particularly, the dose is determined such that the bottom of the recessed pattern formed in the layer 12 after its development does not reach the surface of the substrate 11. The dose varies in accordance with the type of the resist material, but is generally about 1/5 to 1/10 of the dose required for forming the recessed pattern throughout the layer 12.

Figure 1B:
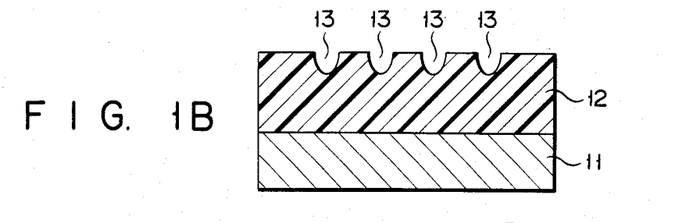

After the beams EB irradiate the layer 12, development is performed with a predetermined development solution or is not performed in accordance with the type of resist material, thereby forming a recessed pattern 13 in the upper layer portion of the layer 12, as shown in fig. 1B. The pattern 13 properly reflects the beam profile of the beams EB. Depths of concaves of the pattern 13 are preferably 0.4 μm or less, and more preferably 0.15 to 0.4 μm. For example, dose of electron beams required to form a recessed pattern having a concave depth of 0.2 μm in a resist material layer having a thickness of 1 μm at an acceleration voltage of 30 KeV are summarized in Table 1.

TABLE 1

| Resist Material | Dose ($\mu C/cm^2$) |
| --- | --- |
| PMMA | 20 |
| φ-MAC | 10 |
| Poly α,α-dimethylbenzylmethacrylate | 20 |
| Poly α,α-methylbenzylmethacrylate | 25 |
| Polyphenylmethacrylate | 75 |
| Poly tert-butylmethacrylate | 83 |
| Diphenylmethacrylate-2,2,3,4,4,4-hexafluorobutylmethacrylate copolymer (copolymerization molar ratio, 1:1) | 32 |
| Diphenylmethacrylate-methylmethacrylate copolymer (copolymerization molar ratio, 1:1) | 58 |

Figure 1C:
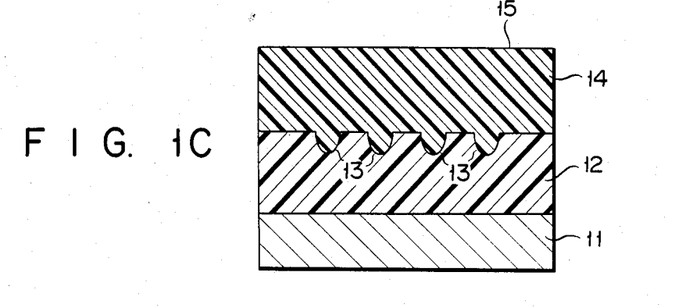
Figure 2:
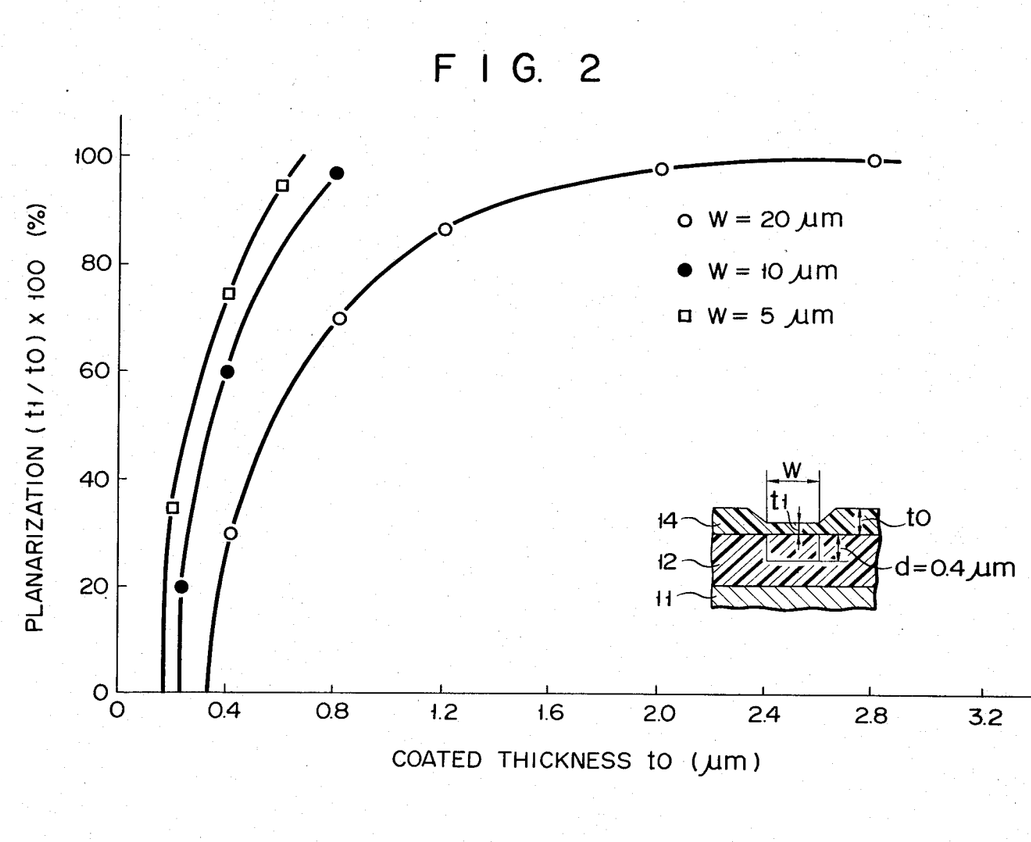
FIG. 2 is a graph for explaining a thickness of a mask layer which is required to flatten a resist layer having a recessed pattern formed according to the present invention.

After the desired pattern 13 is formed in the layer 12, a layer 14 of a mask material which has high resistance to the etchant of the material of the layer 12 is formed to cover the entire surface including the pattern 13 so as to provide a flat surface 15, as shown in FIG. 1C. The mask material used has an etching rate lower than that of the resist material used (generally, 1/10 or less). The mask material includes a material such as silicone resin or spin-on glass which is coated with a spin coater or a material such as amorphous silicon, polyimide resin or carbon which is deposited by reduced pressure deposition. A preferable mask material is silicone resin. Assume that silicone resin as a mask material is applied to the layer 12 having the recessed pattern with a concave depth of 0.4 μm and a width W. In this case, smoothness as a percentage of a ratio ($t_1/t_0$) of a silicon resin thickness $t_1$ at concave of the layer 12 to a silicone resin thickness $t_0$ at the flat surface of the resist layer 12 is plotted as a function of the silicone resin thickness $t_0$ by using the recessed pattern width W as a parameter, as shown in FIG. 2. When planarization ($t_1/t_0$) is 100%, the silicone resin has a flat top surface. In this case, d = 0.4 μm is used because when the depth d = 0.4 μm or less, various recessed patterns can be formed by irradiation of energy beam in substantially the same dose as later described with reference to FIG. 3. FIG. 2 shows that when silicone resin is applied to a thickness of 2.0

μm or more, the surface of the silicon resin can be planarized even over a wide recess.

Figure 1D:
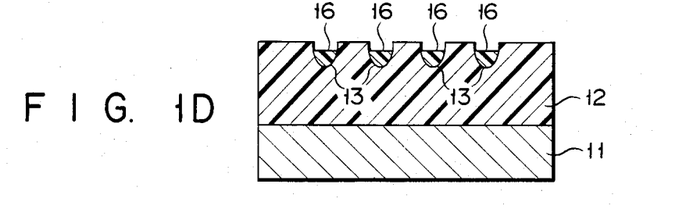

After the layer 14 having the flat surface 15 is formed, the layer 14 is uniformly etched along the direction of its thickness. This etching can be performed by reactive ion etching. The etching of the layer 14 is performed until at least the top surface of the layer 12 is exposed. Preferably, as shown in FIG. 1D, the mask is etched back by a depth corresponding to half of the entire depth of each recess (concave). When the layer 12 is etched using a residual mask pattern 16, the resist pattern width more properly reflects the electron beam size.

Figure 1E:
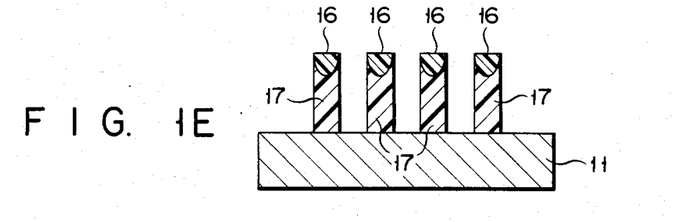

Finally, the layer 12 is etched by anisotropic etching such as reactive ion etching using the pattern 16 as a mask until the surface of the substrate 11 is exposed. Thus, a resist pattern 17 having the line width properly reflecting the beam size of the electron beams can be obtained, as shown in FIG. 1E. Thereafter, the substrate 11 is processed using the pattern 17 as a mask.

When the layer 12 is etched to a depth larger than half of the depth of each recess of the pattern 13, a resist pattern having a line width smaller than the beam size of the electron beams can be obtained.

The above method is exemplified wherein the electron beam is used as a pattern information carrier and a predetermined resist pattern is formed in the electron beam resist material. However, when light, X-rays or ion beams are used as a pattern information carrier, a photoresist material (e.g., AZ 1350J), an X-ray resist material (e.g., FBM-G) and an ion beam resist material (e.g., PMMA) are respectively used to obtain desired resist patterns in the same manner as in the first embodiment described above.

According to the first embodiment described above, the dose of the energy beam irradiating the layer 12 so as to form the pattern 13 is sufficiently smaller (about 1/5 to 1/10) than the conventional dose. Therefore, the influences of a substrate, such as generation of back-scattered electrons, secondary electrons and the standing wave, can be eliminated and a resist micropattern can be formed with high precision. In addition, the dose of the energy beam is small, and thus the radiation time can be shortened. When electron beams are used, a resist layer can be irradiated with beams of the same size as the predetermined pattern, thereby improving the throughput.

Figure 3:
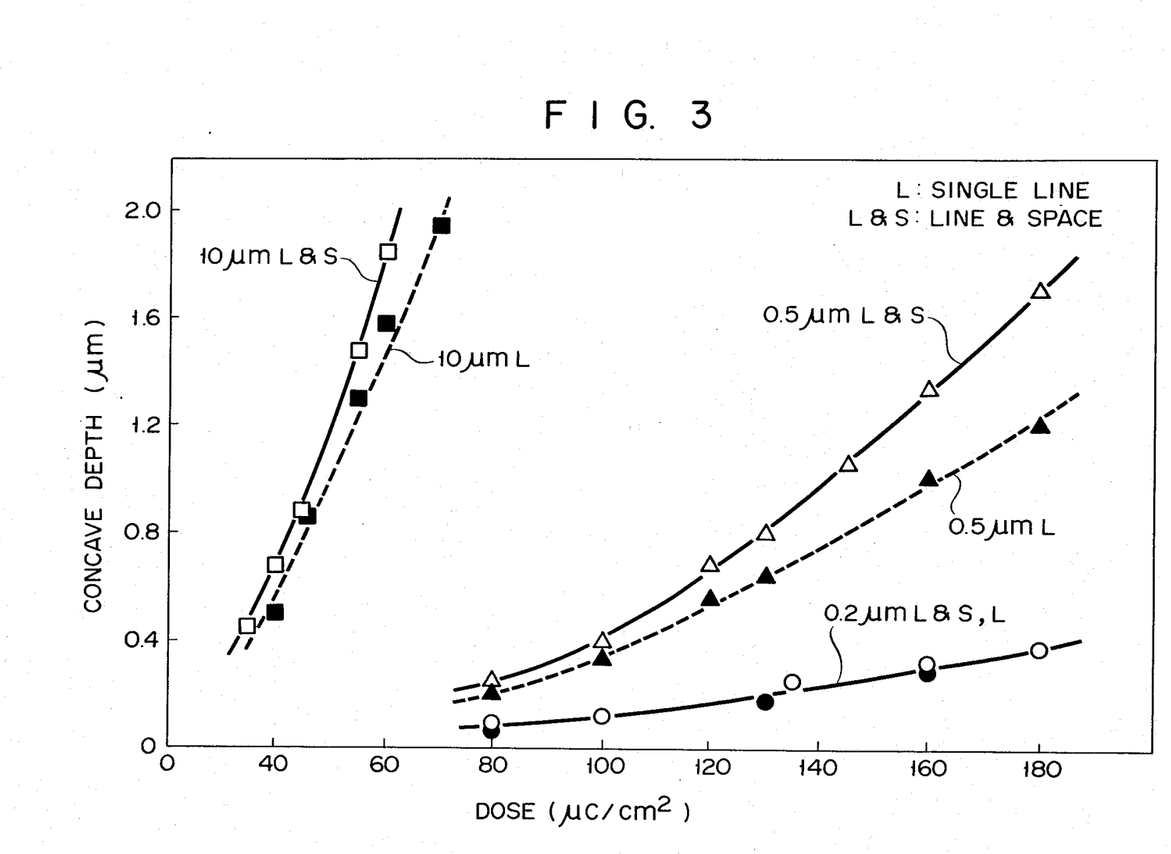
FIG. 3 is a graph for explaining the relationship between the depth of the recess of the recessed pattern formed in the resist layer and the energy beam dose.

In addition, according to the present invention, the influences of a substrate can be eliminated as described above upon radiation of the energy beams, so that an isolated independent recessed pattern (i.e., a single line pattern) and a dense recessed pattern (i.e., a line and space pattern) can be formed with the same high precision. Generally, the energy beam doses required to form the single line pattern and the line and space pattern with the same concave depth slightly differ from each other. However, when the depth of the recess (concave) is 0.4 μm or less, a recessed pattern wherein the single line pattern and the line and space pattern are co-present can be formed with the same given energy beam dose, resulting in convenience. In FIG. 3, the relationship between the electron beam dose and the depth of the recess is shown when the single line patterns and the line and space patterns having line widths of 10 μm, 0.5 μm and 0.2 μm are formed in a PMMA resist layer on a silicon substrate. As is apparent from the graph in FIG. 3, when the depth of the recess is 0.4 μm or less, the single line recessed pattern and the line and space recessed pattern can be formed by irradiation of electron beams in substantially the same dose.

The first embodiment will be described in detail by way of examples.

EXAMPLE 1

A positive resist, a phenylmethacrylatemethacrylic acid copolymer ($\phi$-MAC), was coated on a silicon wafer substrate to a thickness of 1 μm and prebaked at a temperature of 200° C. for an hour. Electron beams having a size of 0.2 μm were irradiated on this sample at an acceleration voltage of 30 KeV. The dose was 10 $\mu C/cm^2$ which was about 1/10 of the conventional pattern formation dose. The resultant structure was dipped in a mixture of 25% of 1,4-dioxane and 75% of diisobutyl ketone to develop the resist film. Thus, a recessed pattern having a depth of 0.15 μm to 0.2 μm and properly reflecting the beam size was formed in the surface portion of the resist film. Then, silicone resin was applied by a spin coater to the entire surface of the resist film to a thickness of 0.6 μm. The surface of the sample became flat. The resultant sample was etched in a reactive ion etching apparatus at a power density of 0.3 $W/cm^2$ for 12 minutes while $CF_4$ gas flowed at a rate of 50 sccm. As a result, silicone resin was etched uniformly from the surface of the resin along the direction of its thickness to a depth corresponding to half of the depth of the recess of the recessed pattern. Thereafter, the sample was etched in the reactive ion etching apparatus again at a power density of 0.3 $W/cm^2$ for 10 minutes while $O_2$ gas flowed at a rate of 50 sccm. A resist pattern having a high aspect ratio was formed under the silicone resin pattern. In this case, the silicone resin pattern was not substantially etched, and only $\phi$-MAC was etched. The resultant pattern size properly reflected the beam size and the size precision was 0.05 μm or less. Unlike the conventional method wherein the pattern size is increased by 0.2 μm due to the back-scattered electrons, the resist pattern with high precision was obtained according to Example 1.

EXAMPLE 2

This example shows a case wherein exposure with light is used. A recessed pattern was transferred to a positive resist AZ 1350J through a photomask having a pattern with a width of 1 μm. The dose was 6 $mJ/cm^2$ which was about 1/10 of the conventional dose. The g line (0.436 μm) was used as the wavelength of light for radiation. Silicone resin was then applied to the sample and etched in the reactive ion etching apparatus in the same manner as in Example 1. The silicone resin layer was lightly over-etched to an about 50 nm above the bottom of the recess. The resist material on the sample was etched in the same manner as in Example 1. The resultant resist pattern had a width of 0.8 μm which was smaller than the photomask width. By controlling the etching conditions of the coated material, the resist pattern having a smaller size than that of the designed pattern could be obtained. In Examples 1 and 2, the recessed pattern was formed with a dose which was about 1/10 of the conventional dose, thereby greatly shortening the processing time.

EXAMPLE 3

In Example 3, a polymer film of poly $\alpha,\alpha$-dimethyl-benzylmethacrylate was applied to a silicon wafer to a thickness of 1 μm. Electron beams were irradiated on the sample at a dose of 20 $\mu C/cm^2$ to form a recessed pattern having a depth of 0.2 μm. Silicone resin was applied to the entire surface of the sample to provide a flat surface, and the silicone resin film and the polymer film were etched in the same manner as in Example 1, thereby obtaining a resist pattern having a width of 1 μm which was the same as the beam size. In the above resist material, main and side chains of the copolymer were dissociated and the molecules were evaporated upon radiation of the electron beams in a known manner. Therefore, the development process can be omitted to simplify the pattern formation process.

EXAMPLE 4

An amorphous silicon film was used in Example 4. The above-mentioned φ-MAC was applied to a silicon wafer to a thickness of 1 μm, and a recessed pattern was formed with electron beams under the same exposure and development conditions. The amorphous silicon film was sputtered on the sample in a sputtering apparatus. The amorphous silicon film can be formed by a known RF sputtering technique at a rate of 0.1 μm/10 minutes. In Example 4, the amorphous silicon film had a thickness of 0.6 μm. The surface of the amorphous silicon film was flat. The amorphous silicon film was etched in a parallel flat plate dry etching apparatus at a power density of 0.38 W/cm$^2$ for about 20 minutes while $CCl_2F_2$ gas was flowed in at a rate of 20 sccm. The amorphous silicon film was uniformly etched to a depth corresponding to half of the depth of the recessed pattern. The φ-MAC was etched in the $O_2$ atmosphere by using the residual amorphous silicon pattern as a mask, thereby forming a resist pattern under the amorphous silicon pattern.

In the first embodiment described above, termination of etching of the layer 14 is controlled by an etching time calculated from an etching rate of the mask material used. However, the etching rate changes in accordance with changes in an etching gas pressure and substrate temperature. Since it is rather difficult to control the termination of etching only by the etching time of the mask material calculated from the etching rate, slight errors occur in the resultant mask pattern. In order to solve this problem, according to a second embodiment of the present invention a detecting means (e.g., a mass or emission spectroscope) and a label material are provided for detecting an interface between the top portion of the layer 12 which is exposed first and the layer 14 when the layer 14 is etched. When the interface is detected, the surface of the residual mask layer 14 has the same level as that of the resist layer 12. When the mask layer is to be further etched, the etching depth is controlled by an etching time calculated in accordance with the etching rate of the mask material and the thickness of the residual mask material. The mask material layer left in the recessed pattern formed in the layer 12 has a very small thickness (e.g., 0.4 μm or less) corresponding to the depth of each recess. Therefore, the pattern 16 can be obtained with very high precision even when the etching is controlled by the calculated etching time. In the following description, the same techniques as in the first embodiment can be used except for the interface detection. Therefore, the preferred techniques in the first embodiment can also be applied to the second embodiment.

Figure 4A:
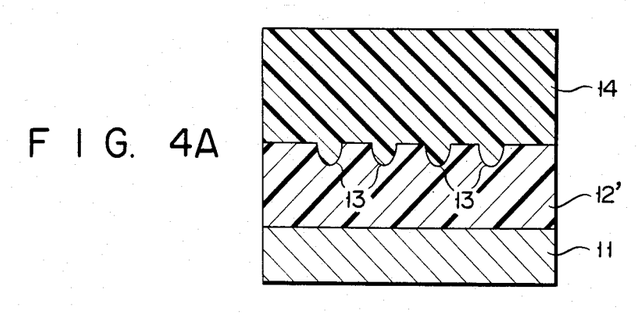
FIGS. 4A to 4C are sectional views for explaining a first sub-embodiment of a second embodiment of the present invention.
Figure 4B:
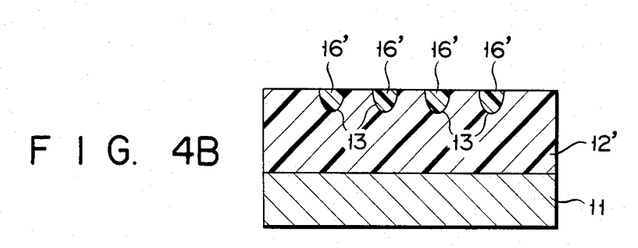
Figure 4C:
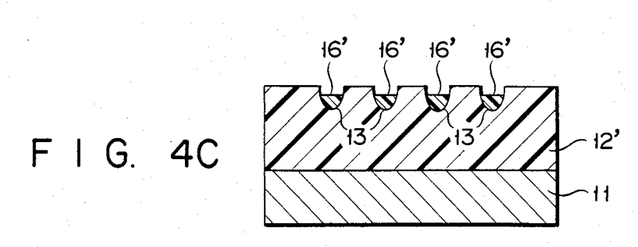

FIGS. 4A to 4C collectively show a first sub-embodiment of the second embodiment. According to the first sub-embodiment, a label material is mixed before-hand in a resist material when a resist material layer 12 is formed on a substrate 11. The label material is defined as a material having an element different from those constituting the resist and mask materials. The interface is detected by detecting changes in a mass or emission spectrum of the element of the label material. The label material is preferably a metal compound compatible with the resist material. The metal compound includes an inorganic metal compound such as zinc halide (e.g., zinc bromide) and an organic metal compound such as an organic aluminum compound (e.g., aluminum tert-butylate, aluminum acetylacetonate, or polymethylaluminoxane). Usually, the concentration of such a label material is 1 to 10% by weight.

A resist material containing the label material is applied to the substrate 11, in the same manner as described with reference to FIG. 1A, to form a resist layer 12'. As described with reference to FIGS. 1A and 1B, energy beams such as electron beams are irradiated on the resultant structure to form a recessed pattern 13. Thereafter, a mask layer 14 is formed on the layer 12' (FIG. 4A).

In the same manner as in the first embodiment, the layer 14 is etched by reactive ion etching. During etching, the mass or emission spectrum of the metal element contained in the layer 12' is detected or monitored.

Figure 5:
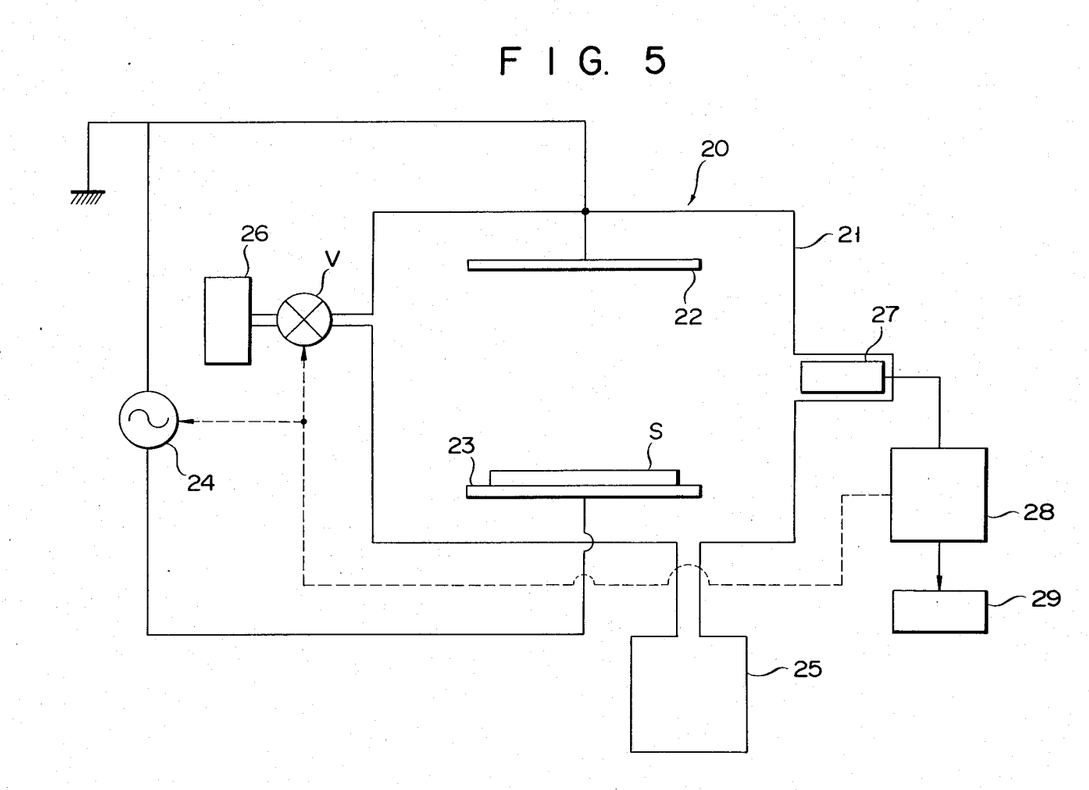
FIG. 5 is a schematic diagram of a device for detecting an interface between the mask layer and the resist layer according to the second embodiment of the present invention.

The reactive ion etching apparatus used in the second embodiment is provided with a mass or emission spectroscope. A typical example is illustrated in FIG. 5. This apparatus 20 includes a vacuum chamber 21. Flat electrodes 22 and 23 are arranged in the chamber 21 to oppose each other and to be parallel to each other. An RF power source 24 is connected to the electrodes 22 and 23. The electrode 22 is grounded, and a structure S of FIG. 4A is placed on the electrode 23 such that the layer 14 is directed toward the electrode 22. A vacuum pump unit 25 and an etching gas supply source 26 are connected to the chamber 21. The apparatus 20 has the same construction as that of the conventional reactive ion etching apparatus, except that a mass or emission spectroscope 27 is arranged in the chamber 21. The spectroscope 27 is connected to a spectrum detector 28 outside the chamber 21. The detector 28 is connected to a recorder 29. Further, the detector 28 may have a construction which provides signals to controll the gas source 26 (or the valve V) and the RF power source 24, as indicated by broken line in FIG. 5.

The layer 14 is etched by the apparatus 20. The same etching technique as in the first embodiment is used, except that the metal element contained in the label material of the layer 12' is monitored by the spectroscope 27. When etching of the layer 14 progresses and an interface between the layers 12' and 14 is exposed, the spectrum of the metal element of the label material contained in the layer 12' is abruptly increased, thereby indicating the interface. When the interface is detected in the manner described above, the surface of the layer 12' has the same level as that of the layer 14, as shown in FIG. 4B. The change in spectrum of the metal element is sharp, thereby allowing the interface to be detected with high precision. Thus, the pattern 16' is formed.

When the mask layer is further etched after the interface is detected, etching is continued in accordance with the etching time calculated from the etching rate of the mask material and the thickness of the residual mask material. For example, when etching is performed for a time calculated in accordance with the etching rate of the mask material and ½ of the thickness of the residual mask film, the etching depth of the residual mask film is half that of the recess of the recessed pattern, as shown in FIG. 4C. Therefore, a mask pattern 16' with higher precision can be obtained in the same manner as in the mask pattern 16.

After the structure of FIG. 4B or FIG. 4C is obtained, in the same manner as described with reference to FIG. 1E the layer 12' is etched using the pattern 16' as an etching mask to obtain a resist pattern similar to the resist pattern 17 shown in FIG. 1E, but with higher precision. The presence of the label material does not present any problem when the layer 12' is anisotropically etched.

In the first sub-embodiment described above, the label material is mixed in the resist layer. However, the label material may be mixed in the mask layer. In this case, the level of the spectrum of the metal element is abruptly decreased when the interface appears.

Figure 6:
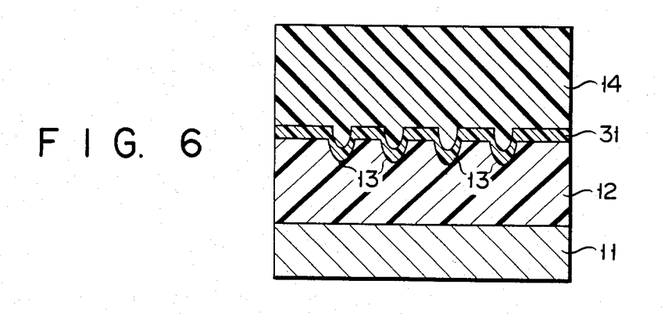
FIG. 6 are respectively sectional views for explaining a second sub-embodiment of the second embodiment of the present invention.

FIG. 6 shows a second sub-embodiment of the second embodiment of the present invention. The second sub-embodiment differs from the first sub-embodiment in that the second sub-embodiment includes a step of coating a mixture of the resist or mask material and the label material on the resist layer to form a label layer 31, between the steps of forming the recessed pattern 13 in the resist layer and of forming the mask layer 14. When the layer 12 is being etched, an interface between the layers 31 and 12 is exposed. In this state, the spectrum level based on the metal element contained in the label layer 31 can be detected. Usually, a thickness of the layer 31 is 0.1 to 0.2 μm, and a concentration of the label material contained therein is 1 to 10% by weight.

Figure 7A:
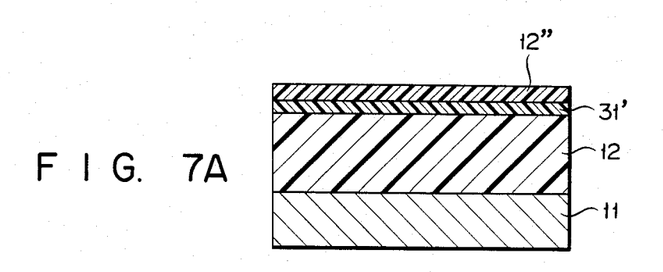
FIGS. 7A to 7D are respectively sectional views for explaining a third sub-embodiment of the second embodiment of the present invention.

FIGS. 7A to 7D collectively show a third sub-embodiment of the second embodiment. According to this sub-embodiment, a first resist layer 12 is formed on a substrate 11, and a label layer 31' of a resist material mixed with the label material is formed to a thickness of, usually 0.05 to 0.15 μm. Thereafter, a second resist layer 12'' is formed on the label layer 31' to a thickness of, usually, 0.1 to 0.2 μm (FIG. 7A). In this case, a total thickness of the layers 31' and 12'' is less than 0.4 μm. The total thickness preferably falls within the range between 0.15 and 0.2 μm.

Figure 7B:
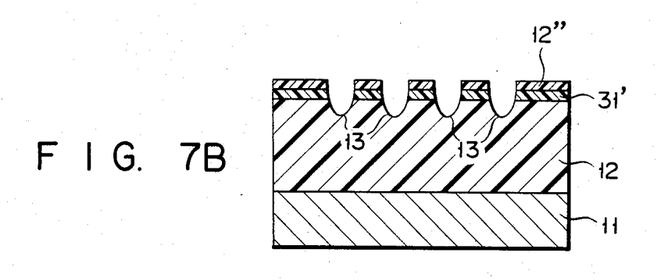
Figure 7C:
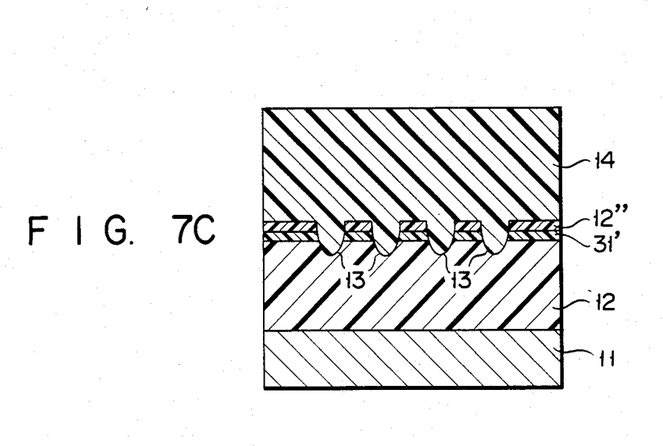

Thereafter, a recessed pattern 13 is formed in the same manner as described with reference to FIGS. 1A and 1B. The recessed pattern extends through the layer 31', as shown in FIG. 7B.

Figure 7D:
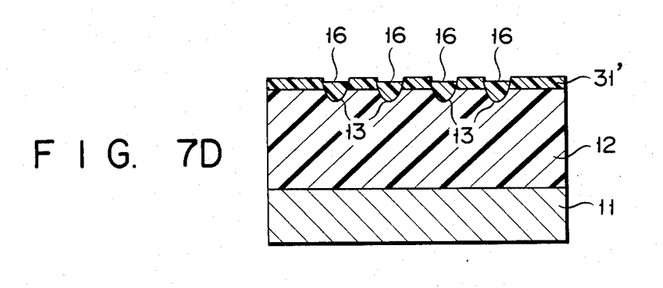

A mask material layer 14 is formed on the surface of the structure of FIG. 7B and etched while the spectrum of the metal element of the label material is detected in the same manner as described with reference to FIG. 4A. When the metal element of the label material is detected, the surface level of the residual material 16 is the same as that of the layer 31', as shown in FIG. 7D.

Thereafter, the residual label layer and the resist material layer 12 are etched using a mask pattern 16 constituted by the residual mask material as an etching mask in the same manner as in the first embodiment wherein the layer 12 is etched, thereby obtaining a desired resist pattern.

In the sub-embodiments described above, the label material is intentionally used. However, the interface detecting means is not limited to the technique using a label material. For example, when a material containing an element other than those constituting the resist material is used for the mask material, the element can be detected in the same manner as the label material to obtain the effect of the second embodiment.

According to the second embodiment, the surface of the resist material layer can be accurately detected, and a desired resist pattern can be formed with higher precision.

The second embodiment will be described in detail by way of examples.

EXAMPLE 5

A resist of phenylmethacrylate-methacrylic acid copolymer (φ-MAC) containing 5% of ZnBr as a label material was coated on a silicon substrate to a thickness of 1.5 μm. The sample was then prebaked at a temperature of 200° C. for an hour. Electron beams were irradiated on the sample which was then developed by a mixture of 25% of 1,4-dioxane and 75% of diisobutyl ketone to form a recessed pattern having a concave depth of 0.2 to 0.3 μm in the surface portion of the resist layer. As shown in FIG. 4A, silicone resin was spin-coated to cover the entire surface so as to obtain a flat surface. In this case, when a thickness of the silicone resin film was 3 μm or more, the entire surface of the substrate could be flattened. The silicone resin film was etched in a reactive ion etching apparatus using $CF_4$ gas. The etching state was monitored by the mass spectroscope 27 (see FIG. 5) connected to the reactive ion etching apparatus. When etching of the silicone resin layer progressed and the flat portion of the resist film was exposed, Zn contained in the resist film was detected by the spectroscope at a mass spectrum M/e =32.5. As shown in FIG. 4B, silicone resin remained only in the recesses and not on the flat portion of the resist film. Thereafter, silicone resin was continuously etched for an etching time calculated from the etching rate of silicone resin and ½ of the thickness of the residual mask film. As shown in FIG. 4C, silicone resin was etched to a depth corresponding to ½ of the depth of each recess. In this case, the etching precision of silicone resin was 20 to 30 nm. The resist material on the sample was etched as in the same manner as in Example 1. As a result, the patterns were obtained with a precision of about 15 to 20 nm, thus providing size control with high precision.

EXAMPLE 6

A polymethylmethacrylate (PMMA) resist was coated on a substrate to a thickness of 1.5 μm and prebaked. Electron beams were irradiated on the sample which was then developed by a mixture of methylisobutyl ketone and isopropanol to obtain a recessed pattern. The sample was then post-baked, and the resist φ-MAC containing 5% of ZnBr as a label material was applied to the sample to a thickness of about 0.1 μm. After prebaking, the recessed pattern was flattened by coating it with a silicone resin.

The silicone resin film was etched by reactive ion etching using $CF_4$ gas. When silicone resin was etched and the φ-MAC was exposed, $Zn^{2+}$ contained in the φ-MAC was detected by the mass spectroscope at M/e =32.5. In this state, no silicone resin remained on the flat portion of the resist film. In order to etch the silicone resin to a depth corresponding to ½ of the depth of the recessed pattern, the etching time was calculated from the etching rate of silicone resin and the thickness of the residual portion. In Example 6, size precision could be 0.05 μm or less. Thereafter, the PMMA layer was etched using the residual mask material as an etching mask to obtain a resist pattern. The ZnBr-contained φ-MAC was used as the label material in Example 6.

However, this material may be used as the resist in place of PMMA.

EXAMPLE 7

A PMMA resist was coated on a substrate 11 to a thickness of 1.5 μm and prebaked. A dilute PMMA material obtained by dissolving an organic metal such as aluminum tert-butylate $Al(OC_4H_9)_3$ as a label material was applied to the sample to a thickness of 50 nm. PMMA was further coated on the sample to a thickness of 0.1 μm and prebaked.

As shown in FIG. 7A, the label material layer was sandwiched between the PMMA layers. The sample was irradiated with electron beams and then developed to obtain a recessed pattern 13 having a depth of 0.3 μm in the surface layer of the resist film, as shown in FIG. 7B. In this case, the width of the recessed pattern 13 properly reflected the beam profile. The label material layer located substantially at the center along the direction of thickness of the recessed pattern was very thin and dissolved upon development of the PMMA layer. Silicone resin was then coated on the sample to flatten the surface. The silicone resin layer was etched by reactive ion etching using $CF_4$ and $O_2$ gases. In this case, etching conditions (e.g., a $CF_4$ flow rate of 50 sccm, $O_2$ flow rate of 10 sccm, a pressure of 10 mTorr, and an RF power of 0.3 W/cm$^2$) were established so as to equalize the etching rate of silicone resin with that of the PMMA resist. The etching state was monitored by the emission spectroscope 27 (FIG. 5). When etching of silicone resin progressed to the point where the surface of the label material layer was exposed, peaks having emission intensities which were five times that obtained by etching of silicone resin were obtained from aluminum at wavelengths of 3,082 Å, 3,093 Å, 3,944 Å and 3,962 Å, respectively. When etching was stopped in this state, silicone resin was etched to a depth corresponding to substantially ½ of the depth of the recessed pattern 16' obtained after the development process, as shown in FIG. 7D. The resultant mask pattern properly reflected the beam size. Thereafter, the residual label layer and the resist layer are etched using the mask pattern 16' as an etching mask to form a resist pattern.

An organic metal such as aluminum acetylacetonate, $Al(CH_2COCH_2\text{-}COCH_3)_3$ or polymethylaluminoxane $—CH_3AlO—_n$ could be used as a label material to obtain the same effect as in Example 7.

EXAMPLE 8

In Examples 5 to 7, the label material was mixed in the resist material layer. However, a label material can be mixed in a mask material. Silicone resin and polyaminoxane were dissolved in ligroin in a ratio of 10:1, and the resultant mixture was used as a mask material. The recessed pattern formed in the surface portion of the PMMA layer was flattened by coating the mask material. When the mask material was etched in the reactive ion etching using $CF_4$ gas, a strong emission spectrum at 3,082 to 3,962 Å was produced from the Al atoms contained in polyaluminoxane. When etching was continued for about 20 minutes, the strength of emission from the mask material was decreased to ½ the initial strength, thereby indicating that none of the mask material remained on the flat portion of the PMMA layer. When etching was further performed for 2 minutes, the mask material was etched to a depth corresponding to about ½ of the depth of the recessed pattern, thus providing pattern control with high precision. Thereafter, the resist layer was etched using the residual mask material as an etching mask to form a resist pattern.

EXAMPLE 9

A label material was not used in Example 9. A recessed pattern was formed with electron beams in the surface portion of the φ-MAC resist film. Silicone resin was coated on the sample to flatten the surface thereof. The silicone resin layer was etched in the reactive ion etching apparatus using $CF_4$ and $O_2$ (20%) gases. A mass spectrum was monitored by the spectroscope. A peak was observed at $M/e = 85$ for about 20 minutes after etching was started. This was because Si in the silicone resin reacted with F in the $CF_4$ gas to form $SiF_3^+$. Thereafter, the intensity at $M/e = 85$ was decreased to ¼ the initial strength, thereby indicating that none of silicone resin remained on the flat portion of the resist film. The sample was further etched for 5 minutes to obtain a mask pattern with high precision.

The present invention has been exemplified by a single layer resist. However, the resist is not limited thereto. The present invention can also be applied to a multi-layer resist. When the present invention is applied to the multi-layer resist, the steps as have been described above are applied to the uppermost resist layer. For example, the present invention can also be applied to a two-layer resist comprising an uppermost layer of a positive resist material and underlying layer of a negative resist material. In this multi-layer resist, a predetermined recessed pattern is formed in the uppermost layer, and a mask material layer is formed thereon. Thereafter, the mask material is etched to form a mask pattern. The uppermost layer and the underlying layer are etched using the mask pattern (residual mask material layer) as a mask. In this case, since the underlying negative resist layer has good resistance to etching during processing of the substrate, as compared with the uppermost positive resist layer, the substrate can be processed with high precision.

What is claimed is:

1. A method of forming a resist pattern on a substrate, comprising the steps of:
   (a) forming a resist on a substrate;
   (b) radiating an energy beam carrying predetermined pattern information onto said resist and forming a recessed pattern in a surface portion of the resist so as not to extend through said resist;
   (c) forming a planar mask layer on said resist including said recessed pattern;
   (d) uniformly etching said mask layer along a direction of thickness thereof until at least a surface of said resist is exposed to allow said mask layer to remain on at least a bottom of said recessed pattern, thereby forming a mask pattern comprising the remaining residual mask layer; and
   (e) etching said resist by using said mask pattern as an etching mask.

2. A method according to claim 1, wherein said recessed pattern has a recess whose depth is not more than 0.4 μm.

3. A method according to claim 2, wherein said mask layer has a thickness of not less than 2.0 μm.

4. A method according to claim 1, wherein said resist comprises a positive resist material.

5. A method according to claim 1, wherein said mask material comprises silicone resin or spin-on glass.

6. A method according to claim 1, wherein said recessed pattern reflects a beam profile of said energy beam.

7. A method according to claim 6, wherein the energy beam comprises an electron beam.

8. A method according to claim 6, wherein said energy beam comprises light.

9. A method according to claim 6, wherein said energy beam comprises X-ray.

10. A method according to claim 6, wherein said energy beam comprises an ion beam.

11. A method according to claim 4, wherein said resist comprises a homopolymer of a monomer selected from the group consisting of α,α-dimethylbenzylmethacrylate, α-methylbenzylmethacrylate, diphenylmethacrylate, triphenylmethacrylate, phenylmethacrylate and tert-butylmethacrylate.

12. A method according to claim 4, wherein said resist comprises a copolymer of at least one first monomer selected from the group consisting of α,α-dimethylbenzylmethacrylate, α-methylbenzylmethacrylate, diphenylmethacrylate, triphenylmethacrylate, phenylmethacrylate and tert-butylmethacrylate, and at least one second monomer represented by a general formula $CH_2=C(CH_3)COOR$ wherein R is an alkyl or haloalkyl group having 1 to 5 carbon atoms.

13. A method according to claim 1, wherein said resist is a single layer resist.

14. A method according to claim 1, wherein said resist comprises a multi-layer resist whose uppermost layer constitutes said resist.

15. A method according to claim 1, further including the steps of adding a label material containing an element other than those constituting a material forming said resist or the mask layer to the material constituting either the resist or the mask layer, and judging an interface between said mask layer and said resist by detecting said label material.

16. A method according to claim 15, wherein said interface is detected based on a change in intensity of a mass or emission spectrum.

17. A method according to claim 1, further including the steps of adding a label material containing an element other than those constituting a material forming said resist or the mask layer to the material constituting either the resist or the mask layer, and judging an interface between said mask layer and said resist with the interface being detected in accordance with the change in intensity of the mass or emission spectrum of said label material.

18. A method according to claim 1, further including the steps of forming a label layer of a label material containing an element other than those of said mask layer and said resist between said resist and said mask layer, and judging the interface between said mask layer and said resist with the label material in said label layer being detected. detected during etching.

19. A method according to claim 18, wherein said label layer is sandwiched between resist layers so as to be located at a central portion along a direction of thickness of said recessed pattern.

20. A method according to claim 12, wherien said mask material comprises silicone resin or spin-on glass.

21. A method according to claim 12, further including the steps of adding a label material containing an element other than those constituting a material forming said resist or the mask layer to the material constituting either the resist or the mask layer, and judging an interface between said mask layer and said resist with the interface being detected in accordance with the change in intensity of the mass or emission spectrum of said label material.

22. A method according to claim 12, further including the steps of forming a label layer of a label material containing an element other than those of said mask layer and said resist between said resist and said mask layer, and judging the interface between said mask layer and said resist with the label material in said label layer being detected.

23. A method according to claim 21, wherein said label layer is sandwiched between resist layers so as to be located at a central portion along a direction of thickness of said recessed pattern.

* * * * *